United States Patent [19]

Chesley

[11]  4,055,754
[45]  Oct. 25, 1977

[54] MEMORY DEVICE AND METHOD OF TESTING THE SAME

[76] Inventor: Gilman D. Chesley, 22431 Starling Drive, Los Altos, Calif. 94022

[21] Appl. No.: 642,765

[22] Filed: Dec. 22, 1975

[51] Int. Cl.² .................... G11C 29/00; G06F 11/00
[52] U.S. Cl. .......................... 235/302.3; 324/73 R; 340/174 ED
[58] Field of Search .............. 235/153 AC, 153 AM; 324/73 R; 340/172.5, 174 ED; 445/1

[56] References Cited

U.S. PATENT DOCUMENTS

| | | | |
|---|---|---|---|
| 3,644,899 | 2/1972 | Boisvert, Jr. | 235/153 AC |
| 3,659,088 | 4/1972 | Boisvert, Jr. | 235/153 AC |
| 3,751,649 | 8/1973 | Hart, Jr. | 235/153 AC |
| 3,815,025 | 6/1974 | Jordan | 324/73 R |
| 3,873,818 | 3/1975 | Barnard | 235/153 AC |
| 3,961,252 | 6/1976 | Eichelberger | 235/153 AC |
| B 483,268 | 3/1976 | Chu et al. | 235/153 AC |

OTHER PUBLICATIONS

Howe, Jr. et al., Troubleshooting Large-Scale Integrated Circuit Units, IBM Technical Disclosure Bulletin, vol. 17, No. 7, Dec. 1974, pp. 1941-1944.
Tsui, Arrangement for Minimized Functional Test of LSI Logic Chips, IBM Technical Disclosure Bulletin, vol. 15, No. 9, Feb. 1973, pp. 2870-2872.
Jordan, Integrated Circuit Testing, IBM Technical Disclosure Bulletin, vol. 13, No. 5, Oct. 1970, pp. 1093-1094.
Balasubramanian, et al., Testing LSI Memory Arrays, IBM Technical Disclosure Bulletin, vol. 17, No. 7 Dec. 1974, pp. 2019-2020.

*Primary Examiner*—Charles E. Atkinson
*Attorney, Agent, or Firm*—Flehr, Hohbach, Test, Albritton & Herbert

[57] ABSTRACT

Integrated circuit memory device and method of testing the same wherein test logic is included in the device for detecting the presence of predetermined patterns applied to the memory cells. The cells are tested in groups to reduce the amount of time required for the test.

3 Claims, 2 Drawing Figures

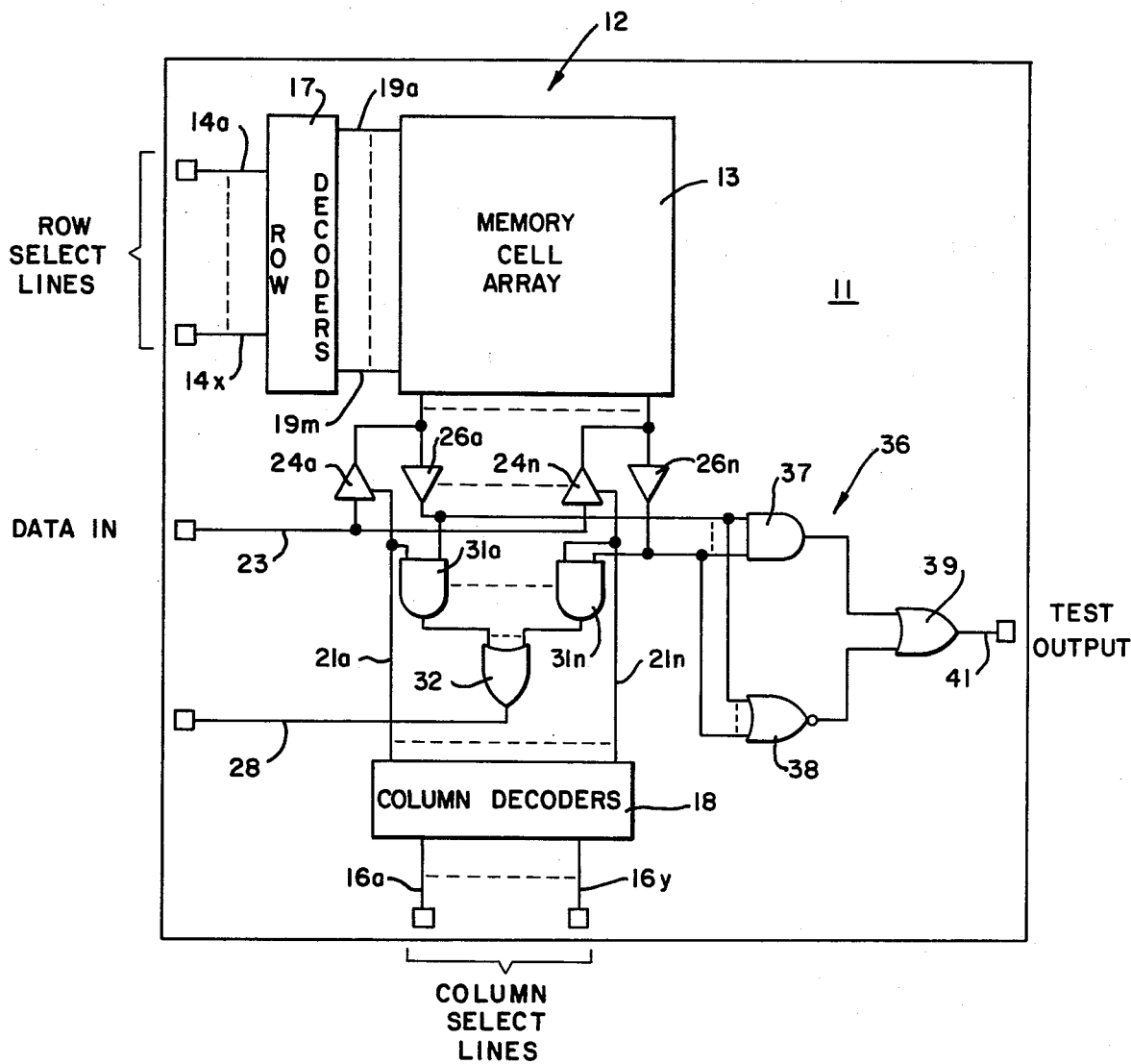
FIG.—1
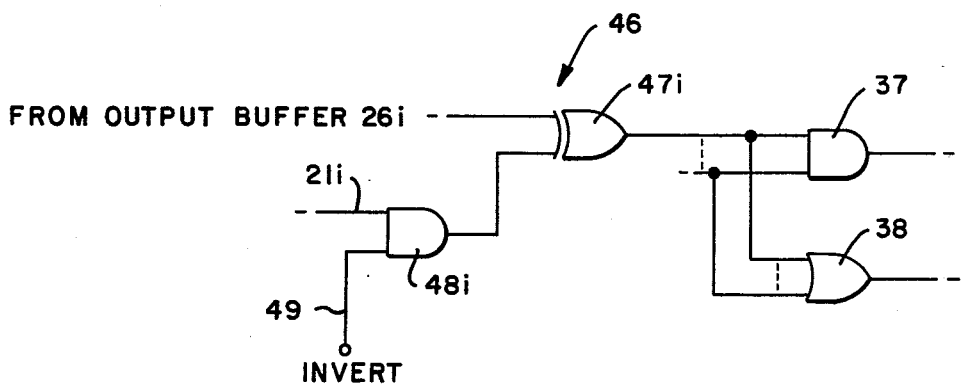
FIG.—2

MEMORY DEVICE AND METHOD OF TESTING THE SAME

BACKGROUND OF THE INVENTION

This invention pertains generally to memory devices and the testing thereof and more particularly to an integrated circuit memory device and method of testing the same.

As memory chips become larger, the testing time required to verify that data is being correctly stored and read has increased, often at an exponentially growing rate. In dynamic wafer scale integration, wherein a relatively large number of memory chips on a single wafer are tested and then interconnected to provide an operative device when power is first applied, the test time is particularly important.

Memory devices such as random access memories (RAMs) are commonly tested by applying signals of known logic levels to the memory cells and reading the signals out of the cells individually to determine whether they are of the proper level. In one commonly used test, known as the "walking ones and zeros test", a signal having a logic level of either one or zero is applied to one of the memory cells and signals of the opposite logic level are applied to the remaining cells. The signals are then read out of the cells individually and tested for the correct logic levels. This test must be repeated for each of the cells in the device, and the entire procedure is repeated with signals of the opposite levels. With a square array of n memory cells of a single bit, this test requires about $2 \times (3n + n^2)$ memory cycles. For example, a 4096 bit RAM operating at a 1 microsecond rate would require a test time of over 30 seconds, and a 16,384 bit memory would take over 8 minutes to test. Thus, it can be seen that the test time for a single RAM chip can be excessive, and when several hundred such chips on a wafer are tested sequentially, the test time is considerable.

SUMMARY AND OBJECTS OF THE INVENTION

The invention provides an integrated circuit memory device and method wherein test logic is included in the device for detecting the presence of predetermined patterns applied to the memory cells. In the preferred embodiments of the device and method, entire rows of the memory cell array are tested simultaneously, and the test time is reduced by a factor proportional to the number of cells in the row.

It is in general an object of the invention to provide a new and improved integrated circuit memory device and method for testing the operation of the same.

Another object of the invention is to provide a memory device of the above character having test logic circuitry formed as an integral part thereof.

Another object of the invention is to provide a memory device and method of the above character in which the memory cells are tested in predetermined groups.

Additional objects and features of the invention will be apparent from the following description in which the preferred embodiments are set forth in detail in conjunction with the accompanying drawings.

BRIEF DESCRIPTION OF THE DRAWINGS

FIG. 1 is a schematic illustration of one embodiment of an integrated circuit memory device incorporating the invention.

FIG. 2 is a block diagram of additional logic circuitry which can be incorporated in the embodiment of FIG. 1 to allow additional tests to be performed on the device.

DESCRIPTION OF THE PREFERRED EMBODIMENTS

As illustrated in FIG. 1, the memory device includes a semiconductor chip 11 on which a random access memory (RAM) 12 is formed. The RAM is of conventional design and includes a plurality of memory cells arranged in an array 13 of m rows and n columns. The RAM also includes row selection lines 14a–14x, column selection lines 16a–16y, row decoders 17 and column decoders 18 by which suitably coded signals are applied to the device and converted to a format suitable for selectively addressing the cells in array 13. Row address signals are delivered from the row decoders to the array on lines 19a–19m, and column address signals are delivered from the column decoders on lines 21a–21n.

Means is also included in RAM 12 for writing data into and reading data out of the memory cells in array 13 according to the address signals on lines 14a–14x and 16a–16y. This means includes a data input line 23 and write drivers 24a–24n, one such driver being provided for each column in the array. The data input line is connected to the data inputs of the drivers, column address lines 21a–21n are connected to the enabling inputs of the drivers, and the outputs of the drivers are connected to the cells in the respective columns of the array.

The means for reading data out of the memory cells includes receivers 26a–26n, data output logic 27 and a data output line 28. An output receiver is provided for each of the columns, and the memory cells in the respective columns are connected to the inputs of the receivers. In the embodiment illustrated, the data output logic comprises AND gates 31a–32n and an OR gate 32. The outputs of the receivers and the address lines for the respective columns are connected to the inputs of the AND gates, and the outputs of these gates are connected to the inputs of OR gate 32. The output of the OR gate is connected to data output line 28.

Although not illustrated, suitable control and timing logic of known design is included on the chip for controlling the operation of the drivers and receivers.

While a particular RAM structure has been described by way of example, it is to be understood that the invention can be utilized with other types of RAMs and other types of integrated circuit memory devices as well. For example, the RAM can have a word size of any desired bit length, and the RAM can be of either the static type or the dynamic type. Likewise, common gated receiver circuitry can be utilized in place of the separate output receivers and column decoder logic, with the test logic connected in front of the receivers. Furthermore, suitable logic can be added to enable data to be written into the array a row at a time for a further increase in speed.

Means is also included as an integral part of the memory device for testing the operation of RAM 12. This means includes test logic 36 which is formed on chip 11 along with the RAM. In the embodiment of FIG. 1, the test logic comprises an AND gate 37 and a NOR gate 38 which serve respectively as all ones and all zeros detectors. These gates each have a plurality of inputs which are connected to the outputs of data output receivers 26a–26n. The outputs of gates 37, 38 are connected to the inputs of an OR gate 39, and the output of this gate is connected to a test output line 41.

Operation and use of the memory device of FIG. 1, and therein the method of the invention, can be described with reference to the walking ones and zeros test. Initially, zeros are written into each cell of the array by the application of suitable signals to data input line, row selection lines 14a–14x, column selection lines 16a–16y, and the control and timing logic. A one is then written into one of the memory cells, and the remaining cells are tested for zeros as follows. A row other than the row containing the cell in which the one is written is read by applying suitable address signals to lines 14a–14x. If all of the cells in the selected row contain zeros, the output of NOR gate 38 will be high, and OR gate 39 will deliver a high output signal to output line 41, indicating that all of the cells in the row are functioning correctly. If any of the cells in the selected row contain a one, the output of NOR gate 38 will be low, and the output of OR gate 39 will also be low, indicating an error in the row. The remaining rows are tested in a similar manner, with the exception of the row containing the cell in which the one is stored. In this embodiment, the cells in the row in which the one is stored are tested individually, as in conventional memory testing.

When all of the rows have been tested, the one is cleared from the first cell and written into a second call, and the entire test is repeated. When all of the cells have been tested in this manner, the entire process is repeated with a zero in one cell and ones in the remaining cells. The presence of ones in all of the cells in a row is detected by AND gate 37 which delivers a high input signal to OR gate 39, producing a high output signal on output line 41, indicating proper operation. If any of the cells in the row contains a zero, the outputs of gates 37 and 39 will be low, indicating a malfunction in the row.

The test logic 36 of the embodiment of FIG. 1 is particularly suited for detecting the presence of all zeros or all ones in a row of the array, and it is therefore particularly suitable for tests such as the walking ones and zeros test. Where other tests are to be performed, other suitable test logic can be provided for detecting other predetermined patterns, such as a checkerboard pattern or a reverse checkerboard pattern containing alternating ones and zeros.

FIG. 2 illustrates an inverter 46 which can be added to the embodiment of FIG. 1 between one or more of the output receivers 26a–n and gates 37, 38 for selectively inverting the signals read out of the array. Each of the inverters includes an exclusive OR gate 47i having one input connected to the output of a receiver 26i. The output of the exclusive OR gate is connected to the inputs of gates 37, 38. Each inverter also includes an AND gate 48i having a first input connected to the address line 21i for the column with which the receiver 26i is associated and a second input connected to a control input line 49. The output of AND gate 48i is connected to a second input of exclusive OR gate 47i.

Operation and use of a memory device having inverters of the type shown in FIG. 2 can now be described. It is again assumed that a walking ones and zeros test is to be performed and that an inverter 46 is provided for each column of the array. The rows are tested for all zeros and all ones in the manner described above, with control line 49 being maintained at a low logic level to prevent inversion of the data from the array. When a row containing a single zero or a single one is reached, the control line 49 and the address line 21i for the column in which the one or zero appears are made high by providing the proper column address, making the output of AND gate 48i for that column high. The high level at the output of the AND gate causes the exclusive OR gate 47i to invert the data from the particular column so that the data presented to gates 37, 38 will be all ones or all zeros if the device is functioning properly. In this manner, the row containing a single one or zero is tested in one memory cycle similr to the manner in which a row containing all ones or all zeros is tested.

The invention has a number of important features and advantages. Test logic suitable for performing desired tests on a memory device is included as an integral part of the device. The memory cells are tested in groups, and this results in a substantial saving in test time. Data from the cells in each group is combined to provide a single output signal which indicates the condition of all of the cells in the group. With the embodiment of FIG. 1, for example, the time required for testing the rectangular array of memory cells arranged in rows and columns is reduced by a factor proportional to the number of cells in a row. The test time is further reduced when the inverter of FIG. 2 is used for groups containing a single one or zero. Further more, the inverter control logic of FIG. 2 could be extended to allow a multiplicity of control lines to cause inversion to test for any desired pattern with dynamic selection. The test logic can be chosen to accommodate any desired pattern of logic levels which are stored in the memory cells, and the invention can be utilized with wafers containing any desired number of memory chips.

It is apparent from the foregoing that a new and improved memory device and method of testing the same have been provided. While only certain presently preferred embodiments have been described, certain changes and modifications can be made without departing from the scope of the invention as defined by the following claims.

What is claimed is:

1. In an integrated circuit memory device: a plurality of memory cells, means for writing data into and reading data out of the memory cells, first coincidence gate means responsive to data read simultaneously out of a group of the memory cells for determining whether all of the data from said group is of a first logic level, second coincidence gate means responsive to data read simultaneously out of the group of cells for determining whether all the data from said group is of a second logic level, and output gate means responsive to the outputs of the first and second coincidence gate means for delivering an output signal when the data read out of the group of cells is either all of the first logic level or all of the second logic level.

2. The memory device of claim 1 further including inverter means connected between the memory cells and the gate means for selectively inverting the data read out of one of the cells in the group.

3. The memory device of claim 1 wherein the first coincidence gate means comprises an AND gate, the second coincidence gate means comprises a NAND gate, and the output gate means comprises an OR gate.

* * * * *